US 11,767,848 B2

(12) United States Patent
Suzuki et al.

(10) Patent No.: US 11,767,848 B2
(45) Date of Patent: Sep. 26, 2023

(54) POWER CONVERSION APPARATUS, MOTOR DRIVE APPARATUS, BLOWER, COMPRESSOR, AND AIR CONDITIONER

(71) Applicant: Mitsubishi Electric Corporation, Tokyo (JP)

(72) Inventors: Motoya Suzuki, Tokyo (JP); Satoru Ichiki, Tokyo (JP); Keisuke Uemura, Tokyo (JP); Koichi Arisawa, Tokyo (JP); Kazunori Hatakeyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 11 days.

(21) Appl. No.: 17/763,686

(22) PCT Filed: Nov. 14, 2019

(86) PCT No.: PCT/JP2019/044746
§ 371 (c)(1),
(2) Date: Mar. 25, 2022

(87) PCT Pub. No.: WO2021/095209
PCT Pub. Date: May 20, 2021

(65) Prior Publication Data
US 2022/0349407 A1    Nov. 3, 2022

(51) Int. Cl.
*F04D 13/06* (2006.01)
*F04D 27/00* (2006.01)
(Continued)

(52) U.S. Cl.
CPC ....... *F04D 13/0693* (2013.01); *F04D 27/001* (2013.01); *H01L 29/1608* (2013.01); *H02K 7/14* (2013.01); *H02P 27/08* (2013.01)

(58) Field of Classification Search
CPC ............. H02P 2201/03; H02P 2201/07; H02P 2201/09; H02P 2201/13; H02P 27/00;
(Continued)

(56) References Cited

U.S. PATENT DOCUMENTS

2018/0226881 A1* 8/2018 Chae .................. H02M 3/1582
2019/0229641 A1   7/2019 Umehara et al.

FOREIGN PATENT DOCUMENTS

JP   2017-208976 A   11/2017
WO  2018/070012 A1   4/2018

OTHER PUBLICATIONS

Office Action dated Jul. 19, 2022 issued in a corresponding Japanese Patent Application No. 2021-555726 (and English machine translation).

(Continued)

*Primary Examiner* — Antony M Paul
(74) *Attorney, Agent, or Firm* — POSZ LAW GROUP, PLC

(57) ABSTRACT

The power conversion apparatus includes a converter circuit that converts an alternating-current voltage output from an alternating-current power supply into a direct-current voltage. The converter circuit includes unit converters. The power conversion apparatus includes current detectors that detect respective currents flowing through respective reactors. In first and second unit converters adjacent to each other among the unit converters, a phase difference between a first phase and a second phase is changed from a reference phase difference when a total current of currents detected by the respective current detectors is greater than a threshold. The first phase is a phase at a time when the switching element of the first unit converter is turned on. The second phase is a phase at a time when the switching element of the second unit converter is turned on.

10 Claims, 9 Drawing Sheets

(51) Int. Cl.
  *H01L 29/16* (2006.01)
  *H02K 7/14* (2006.01)
  *H02P 27/08* (2006.01)

(58) Field of Classification Search
  CPC .......... H02P 27/04; H02P 27/06; H02P 27/08;
       H02P 21/00; H02P 21/0003; H02P 21/02;
       H02P 21/22; H02P 23/00; H02P 23/07;
       H02P 11/00; H02P 11/04; H02P 11/06;
         H02P 6/00; H02P 6/10; H02P 6/28
  See application file for complete search history.

(56) References Cited

OTHER PUBLICATIONS

International Search Report of the International Searching Authority dated Jan. 7, 2020, issued in corresponding International Application No. PCT/JP2019/044746 (and English Machine Translation).

* cited by examiner

POWER CONVERSION APPARATUS, MOTOR DRIVE APPARATUS, BLOWER, COMPRESSOR, AND AIR CONDITIONER

CROSS REFERENCE TO RELATED APPLICATION

This application is a U.S. National Stage Application of International Application No. PCT/JP2019/044746, filed on Nov. 14, 2019, the contents of which are incorporated herein by reference.

FIELD

The present invention relates to a power conversion apparatus that converts an alternating-current (AC) voltage output from an AC power supply into a direct-current (DC) voltage, to a motor drive apparatus including the power conversion apparatus, to a blower and to a compressor including the motor drive apparatus, and to an air conditioner including the blower or the compressor.

BACKGROUND

Patent Literature 1 below describes an interleaved converter that generates a desired output voltage by driving n-phase switching output stages with a phase difference of 360 degrees (°)/n, which interleaved converter performs current balance control on phases based on the return current signal corresponding to the current detected for each reactor and on the return voltage signal.

CITATION LIST

Patent Literature

Patent Literature 1: Japanese Patent Application Laid-open No. 2017-208976

SUMMARY

Technical Problem

However, the technology of Patent Literature 1 performs the current balance control regardless of the magnitude of the reactor current flowing through a reactor. The current balance control indeed equalizes reactor currents, but causes a reduction in efficiency of the converter. Thus, the technology of Patent Literature 1 presents a problem in reduction in efficiency of the converter.

The present invention has been made in view of the foregoing, and it is an object of the present invention to provide a power conversion apparatus capable of equalizing reactor currents while reducing a reduction in efficiency of the converter.

Solution to Problem

To solve the problem and achieve the object described above, a power conversion apparatus according to the present invention includes a converter circuit comprising a plurality of unit converters and converting an alternating-current voltage output from an alternating-current power supply into a direct-current voltage, the unit converters each comprising a reactor and at least one switching element. The power conversion apparatus further includes a plurality of current detectors detecting currents flowing through the respective reactors. In first and second unit converters adjacent to each other among the unit converters, when a first current is greater than a threshold, a phase difference between a first phase and a second phase is changed from a reference phase difference, the first current being a total current or an average current of currents detected by the plurality of current detectors. The first phase is a phase at a time when the switching element of the first unit converter is turned on. The second phase is a phase at a time when the switching element of the second unit converter is turned on.

Advantageous Effects of Invention

A power conversion apparatus according to the present invention provides an advantage in being capable of equalizing reactor currents while reducing a reduction in efficiency of the converter.

DESCRIPTION OF EMBODIMENTS

A power conversion apparatus, a motor drive apparatus, a blower, a compressor, and an air conditioner according to embodiments of the present invention will be described below with reference to the accompanying drawings. Note that the following embodiments are not intended to limit the scope of the present invention. Note also that the following description refers to an electrical connection simply as "connection".

First Embodiment

Figure 1:
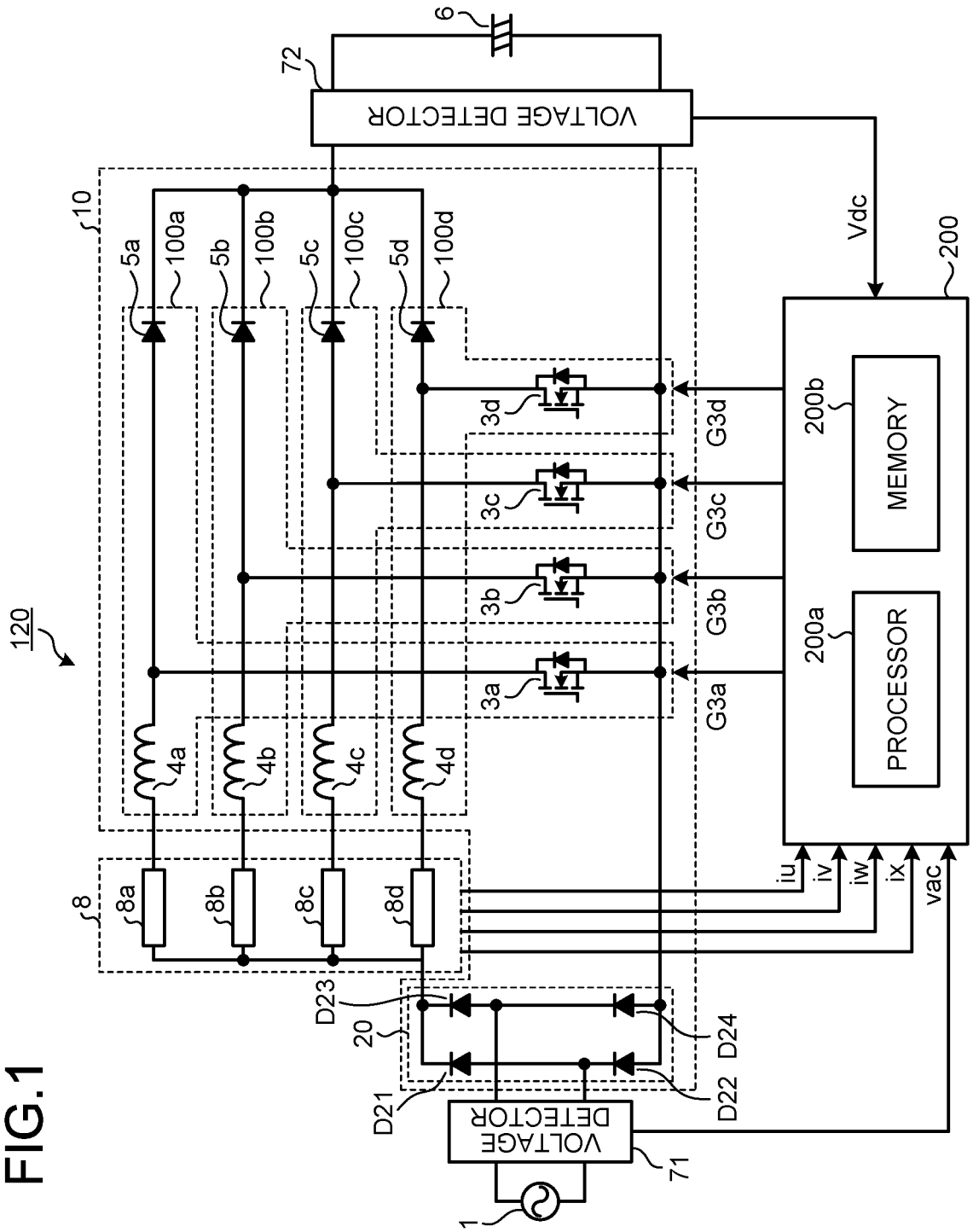
FIG. 1 is a diagram illustrating a configuration of a power conversion apparatus according to a first embodiment.

FIG. 1 is a diagram illustrating a configuration of a power conversion apparatus 120 according to a first embodiment. The power conversion apparatus 120 according to the first embodiment includes a converter circuit 10, a smoothing capacitor 6, a current detection unit 8, voltage detectors 71 and 72, and a control device 200. The current detection unit 8 includes four current detectors 8a, 8b, 8c, and 8d.

The converter circuit 10 converts an AC voltage output from an AC power supply 1 into a DC voltage. The smoothing capacitor 6 smooths and holds the DC voltage obtained by the conversion performed by the converter circuit 10.

The converter circuit 10 includes unit converters 100a, 100b, 100c, and 100d and a rectification circuit 20.

In the converter circuit 10, the unit converters 100a, 100b, 100c, and 100d are connected in parallel with one another. The unit converters 100a, 100b, 100c, and 100d operate sequentially with a predetermined period. This period is called "interleaving period".

The rectification circuit 20 includes four diodes D21, D22, D23, and D24 connected in a bridge configuration. The rectification circuit 20 rectifies the AC voltage output from the AC power supply 1, and applies the voltage that has been rectified to the unit converters 100a, 100b, 100c, and 100d.

The unit converter 100a includes a reactor 4a, a backflow-preventing diode 5a, and a switching element 3a. The unit converter 100b includes a reactor 4b, a backflow-preventing diode 5b, and a switching element 3b. The unit converter 100c includes a reactor 4c, a backflow-preventing diode 5c, and a switching element 3c. The unit converter 100d includes a reactor 4d, a backflow-preventing diode 5d, and a switching element 3d.

In the converter circuit 10, a combination of one reactor and one switching element is defined as "phase", and is counted as "one phase".

FIG. 1 illustrates an example of four phases having a configuration of four-phase interleaving. Note that the application of the present invention is not limited to four-phase interleaving, but may also be two-, three-, or five-or-more-phase interleaving. That is, the present invention is directed to an interleaved power conversion apparatus that includes unit converters of multiple phases.

In the unit converter 100a, the reactor 4a has another end connected to the anode of the backflow-preventing diode 5a. The cathode of the backflow-preventing diode 5a is connected to the positive electrode-side terminal of the smoothing capacitor 6. The junction point between the reactor 4a and the backflow-preventing diode 5a is connected to one end of the switching element 3a. The unit converters 100b, 100c, and 100d are configured similarly to the unit converter 100a. In addition, in the unit converters 100a, 100b, 100c, and 100d, the switching elements 3a, 3b, 3c, and 3d have another ends also connected to one another.

An example of each of the switching elements 3a and 3b is a metal oxide semiconductor field-effect transistor (MOSFET). An insulated gate bipolar transistor (IGBT) may be used instead of a MOSFET.

The switching elements 3a and 3b each include a diode connected in antiparallel between the drain and the source. Connection in antiparallel means that the drain of a MOSFET is connected with the cathode of the diode, and the source of the MOSFET is connected with the anode of the diode. Note that the diode may be a parasitic diode inside the MOSFET itself. A parasitic diode is also called a body diode.

Note that the switching elements 3a, 3b, 3c, and 3d are not limited to a MOSFET formed of silicon, but may also be a MOSFET formed of a wide bandgap semiconductor such as silicon carbide, gallium nitride, gallium oxide, or diamond.

A wide bandgap semiconductor generally has a higher voltage resistance and a higher heat resistance than a silicon semiconductor. Thus, use of a wide bandgap semiconductor for the switching elements 3a, 3b, 3c, and 3d increases voltage resistance and allowable current density of each of the switching elements, thereby allowing size reduction of the semiconductor module incorporating these switching elements.

The current detector 8a detects a reactor current iu flowing through the reactor 4a. The current detector 8b detects a reactor current iv flowing through the reactor 4b. The current detector 8c detects a reactor current iw flowing through the reactor 4c. The current detector 8d detects a reactor current ix flowing through the reactor 4d.

The voltage detector 71 detects an AC voltage vac, which is the output voltage of the AC power supply 1. The voltage detector 72 detects a capacitor voltage Vdc, which is the voltage across the smoothing capacitor 6.

The control device 200 includes a processor 200a and a memory 200b. The control device 200 receives a detection value of the reactor current iu detected by the current detector 8a. The control device 200 receives a detection value of the reactor current iv detected by the current detector 8b. The control device 200 receives a detection value of the reactor current iw detected by the current detector 8c. The control device 200 receives a detection value of the reactor current ix detected by the current detector 8d. The control device 200 receives a detection value of the AC voltage vac detected by the voltage detector 71. The control device 200 receives a detection value of the capacitor voltage Vdc detected by the voltage detector 72.

The control device 200 computes a total current isum, which is the sum of the values of the reactor currents iu, iv, iw, and ix, using the detection values of the respective reactor currents iu, iv, iw, and ix. The control device 200 generates gate signals G3a, G3b, G3c, and G3d based on the total current isum, on the AC voltage vac, and on the capacitor voltage Vdc.

The unit converters 100a, 100b, 100c, and 100d each include a gate drive circuit not illustrated. The gate drive circuit of the unit converter 100a generates a drive pulse using the gate signal G3a output from the control device 200, and applies the drive pulse generated, to the gate of the switching element 3a to drive the switching element 3a.

The gate drive circuit of the unit converter 100b generates a drive pulse using the gate signal G3b output from the control device 200, and applies the drive pulse generated, to the gate of the switching element 3b to drive the switching element 3b.

The gate drive circuit of the unit converter 100c generates a drive pulse using the gate signal G3c output from the control device 200, and applies the drive pulse generated, to the gate of the switching element 3c to drive the switching element 3c.

The gate drive circuit of the unit converter 100d generates a drive pulse using the gate signal G3d output from the control device 200, and applies the drive pulse generated, to the gate of the switching element 3d to drive the switching element 3d.

Note that the gate signals G3a, G3b, G3c, and G3d may be generated using an average current iavg, which is the average value of the values of the reactor currents iu, iv, iw, and ix, instead of using the total current isum. Note that the following description may refer to the total current isum or the average current iavg as "first current".

A specific operation of the control device 200 will be described later. Note that the detection value of the AC voltage vac detected by the voltage detector 71, among the detection values input to the control device 200, is used for reduction of distortion of a current flowing through the converter circuit 10. Therefore, the fundamental operation of the converter circuit 10 can be controlled without including the voltage detector 71.

In the control device 200, the processor 200a is computing means such as a computing unit, a microprocessor, a microcomputer, a central processing unit (CPU), or a digital signal processor (DSP). The memory 200b is a non-volatile or volatile semiconductor memory such as a random access memory (RAM), a read-only memory (ROM), a flash memory, an erasable programmable ROM (EPROM), or an electrically EPROM (EEPROM) (registered trademark).

The memory 200b stores programs for performing the functionality of the control device 200 described above and functionality of the control device 200 described later. The processor 200a provides and receives needed information via an interface including an analog-to-digital converter and a digital-to-analog converter (both not illustrated), and the processor 200a executes a program stored in the memory 200b to perform necessary processing. A result of computation by the processor 200a is stored in the memory 200b.

When one of the switching elements 3a, 3b, 3c, and 3d is controlled and performs a switching operation, power supplied from the AC power supply 1 is stored in the corresponding reactor. The control device 200 performs control of causing the switching elements 3a, 3b, 3c, and 3d to perform switching operation at a predetermined duty so that the voltage output from the converter circuit 10 is a desired voltage.

A difference that may occur between the reactor currents of a pair of phases during operation of the power conversion apparatus 120 according to the first embodiment will next be described. A difference between the reactor currents of a pair of phases will be referred to hereinafter as "current difference".

Figure 2:
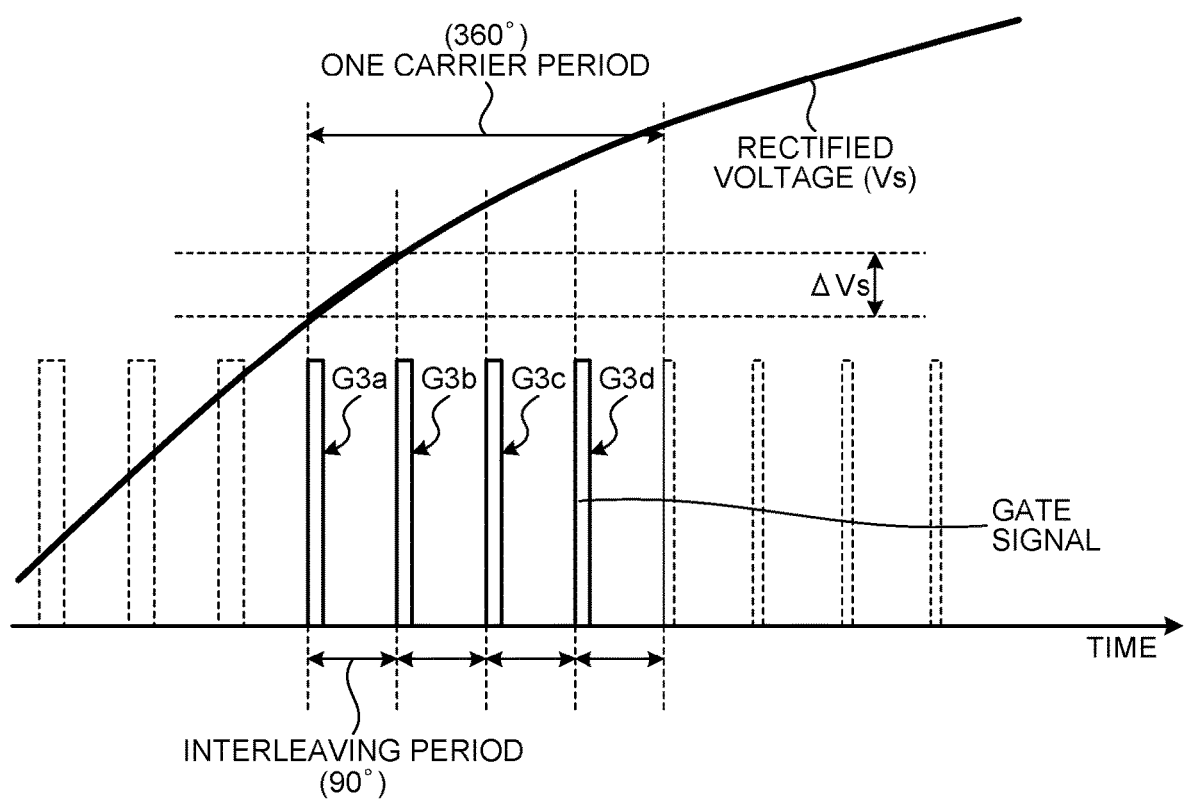
FIG. 2 is a waveform chart for use in describing an operation of the power conversion apparatus according to the first embodiment.

FIG. 2 is a waveform chart for use in describing an operation of the power conversion apparatus 120 according to the first embodiment. The horizontal axis represents time.

In FIG. 2, the waveform represented by the bold line represents a rectified voltage Vs. The rectified voltage Vs is the output voltage from the rectification circuit 20, and is also the voltage applied to the unit converters 100a, 100b, 100c, and 100d. The four pulses represented by the solid lines represent the gate signals in a carrier period of interest. Specifically, the four pulses represent, from left to right in the positive direction of the time axis, the gate signal G3a, the gate signal G3b, the gate signal G3c, and the gate signal G3d.

The gate signals G3a, G3b, G3c, and G3d are pulse width modulation (PWM) signals. As compared to these gate signals, the gate signals represented by broken lines in one carrier period before the carrier period of interest each have a pulse width greater than the pulse width of each of the gate signals in the carrier period of interest. In addition, the gate signals represented by broken lines one carrier period after the carrier period of interest each have a pulse width less than the pulse width of each of the gate signals in the carrier period of interest. Moreover, the interval between each pair of adjacent gate signals of the gate signals G3a, G3b, G3c, and G3d corresponds to the interleaving period.

One carrier period is the period of carrier signals. The interleaving period in a power conversion apparatus that performs four-phase interleaving is 90° when the phase range during one carrier period is 360°. The carrier signals will be described later.

A change in the reactor current flowing through the reactor upon turning on of the switching element in each of the unit converters will next be described. Note that a change in a reactor current is called "current ripple", and the current ripples of the respective unit converters 100a, 100b, 100c, and 100d are respectively denoted by $\Delta Iu$, $\Delta Iv$, $\Delta Iw$, and $\Delta Ix$. These current ripples $\Delta Iu$, $\Delta Iv$, $\Delta Iw$, and $\Delta Ix$ can be expressed by Equations (1) to (4) below.

$$\Delta Iu = (Vac\_u/La) \cdot Ton\_a \quad (1)$$

$$\Delta Iv = (Vac\_v/Lb) \cdot Ton\_b \quad (2)$$

$$\Delta Iw = (Vac\_w/Lc) \cdot Ton\_c \quad (3)$$

$$\Delta Ix = (Vac\_x/Ld) \cdot Ton\_d \quad (4)$$

In Equations (1) to (4) above, La, Lb, Lc, and Ld represent the inductance values of the respective reactors 4a, 4b, 4c, and 4d. In addition, Ton_a, Ton_b, Ton_c, and Ton_d represent the On times upon turning on of the respective switching elements 3a, 3b, 3c, and 3d. Moreover, Vac_u, Vac_v, Vac_w, and Vac_x represent the instantaneous values of the respective reactor voltages appearing across the reactors 4a, 4b, 4c, and 4d when the switching elements 3a, 3b, 3c, and 3d are turned on.

Assuming here that the voltage is applied to each of the unit converters for a fixed period of time, and that the reactors of the respective unit converters 100a, 100b, 100c, and 100d vary from piece to piece only to a sufficiently low degree, the instantaneous values Vac_u, Vac_v, Vac_w, and Vac_x of the respective reactor voltages are almost the same as one another. That is, a relationship of Vac_u=Vac_v=Vac_w=Vac_x can be reasonably considered to hold during one carrier period. In this case, use of the same duty factor for the pulse signals of the respective switching elements during one carrier period results in the same current ripple during one carrier period. This then results in the same average current for the reactors.

On the contrary, the AC power supply 1 of the power conversion apparatus 120 according to the first embodiment is a voltage source having a power supply period; therefore, the voltage applied to each of the unit converters varies over time. FIG. 2 illustrates a situation in which the voltage applied to the unit converter 100b when the switching element 3b of the unit converter 100b is turned on is higher by an amount of ΔVs than the voltage applied to the unit converter 100a when the switching element 3a of the unit converter 100a is turned on.

Thus, when a voltage source having a power supply period is used, driving the switching elements with gate pulses having the same duty value will cause the current ripples of the respective reactor currents to have values different from one another. A difference in the values of the current ripples in one carrier period then cause a difference among the average values of the respective reactor currents over one power supply period. In addition, when the inductance values of the respective reactors are not the same as one another, the relationship of Vac_u=Vac_v=Vac_w=Vac_x does not hold, thereby causing a difference among the average values of the respective reactor currents.

Figure 3:
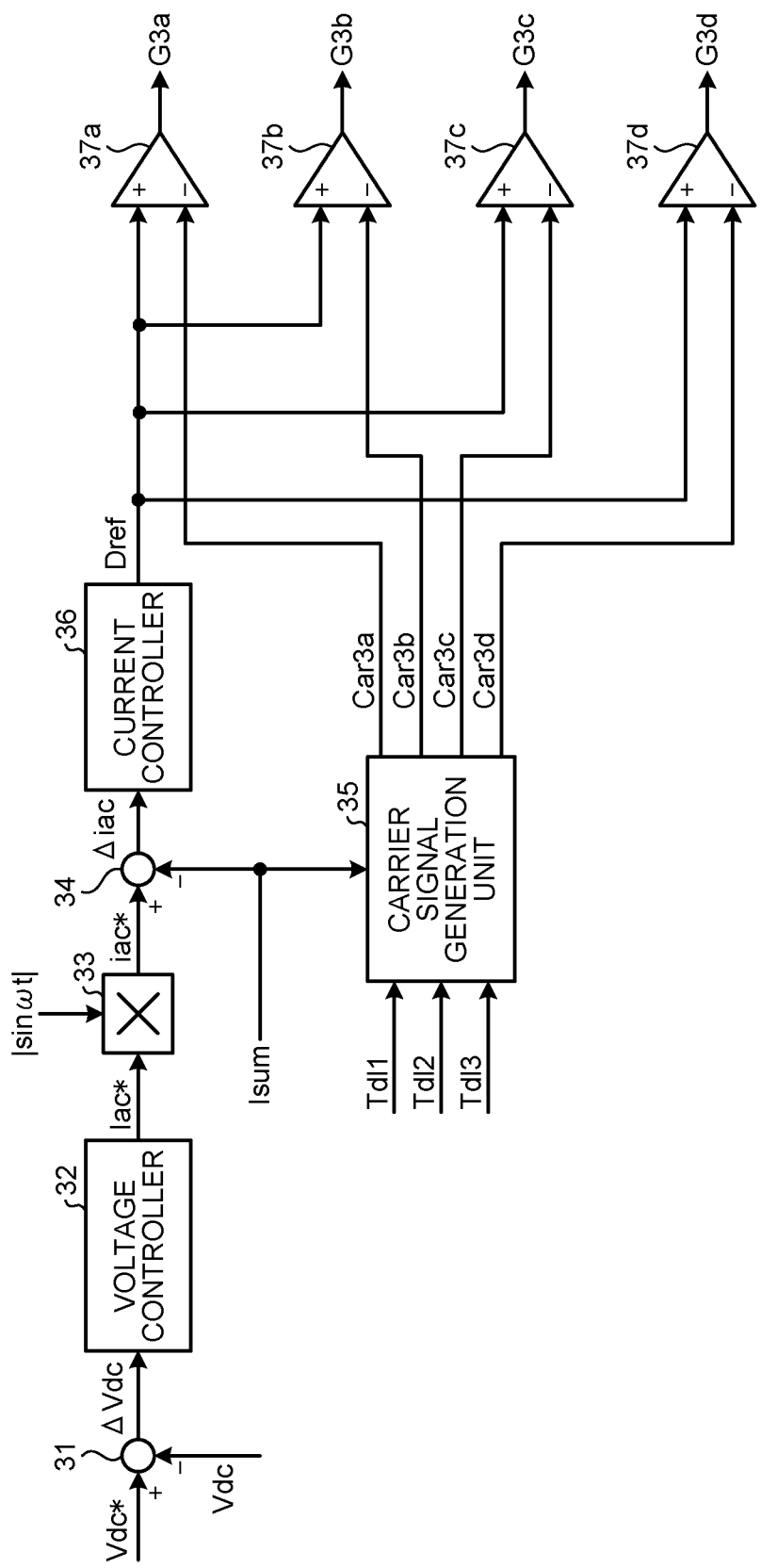
FIG. 3 is a block diagram illustrating an example configuration of a control system in the first embodiment.
Figure 4:
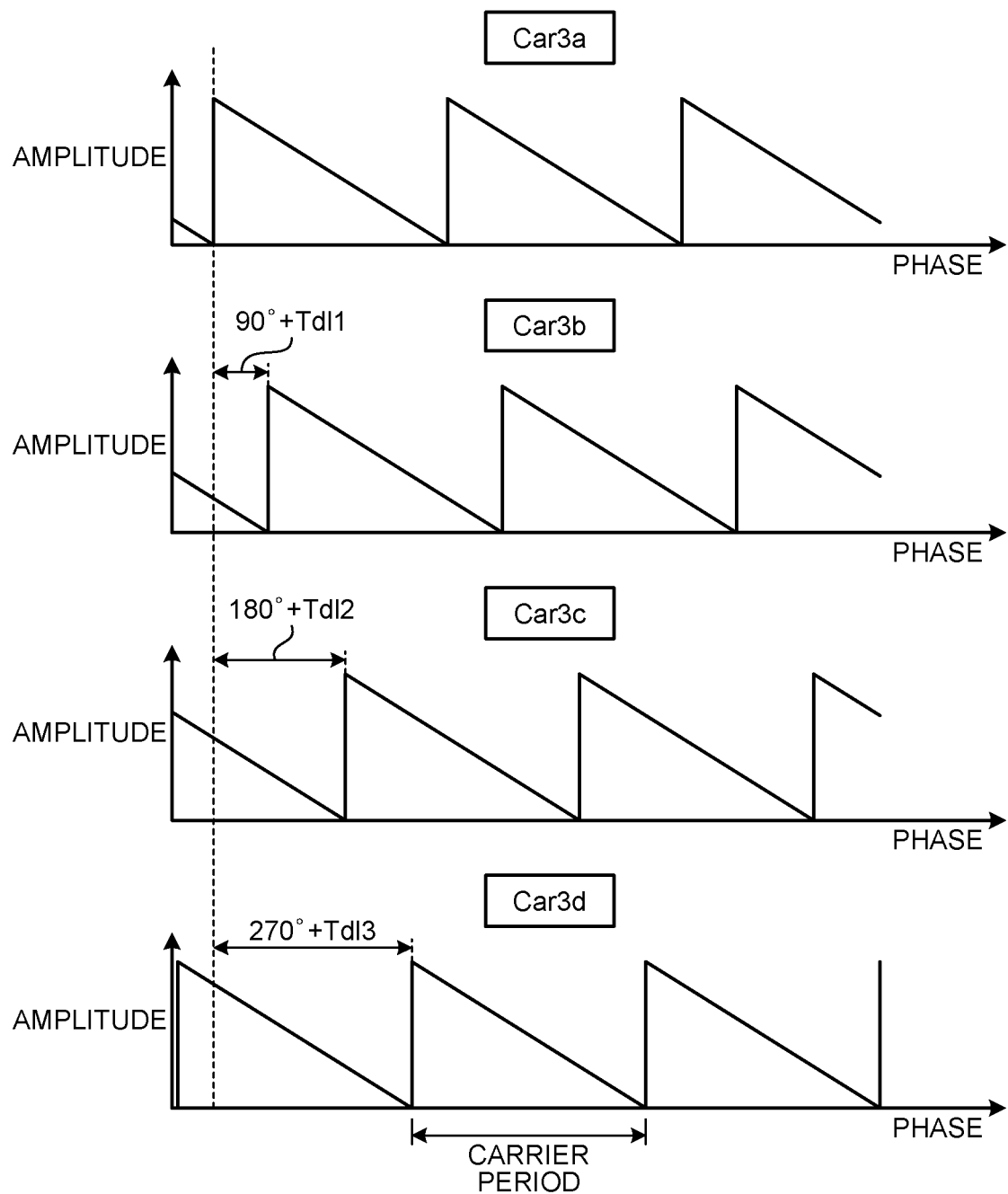
FIG. 4 is a diagram illustrating example waveforms of carrier signals generated by the control system illustrated in FIG. 3.

A control system for reducing the differences among the average values of the respective reactor currents described above will next be described. FIG. 3 is a block diagram illustrating an example configuration of a control system in the first embodiment. The control system illustrated in FIG. 3 is included in the control device 200. FIG. 4 is a diagram illustrating example waveforms of the carrier signals generated by the control system illustrated in FIG. 3.

The control system in the first embodiment includes, as illustrated in FIG. 3, subtractors 31 and 34, a voltage controller 32, a multiplier 33, a carrier signal generation unit 35, a current controller 36, and comparators 37a, 37b, 37c, and 37d. An example of each of the voltage controller 32 and the current controller 36 is a proportional integral (PI) controller. A case will be described below by way of example in which the voltage controller 32 and the current controller 36 are each a PI controller.

The subtractor 31 computes a deviation ΔVdc between a predetermined command value Vdc* of the capacitor voltage Vdc and the detection value of the capacitor voltage Vdc. The voltage controller 32 provides PI control on the deviation ΔVdc to generate an amplitude command value Iac* for the total current Isum.

The multiplier 33 multiplies the amplitude command value Iac* for the total current Isum by an absolute value |sin ωt| of a sine wave signal having an angular frequency of ω (=2πf), where f is the frequency of the AC voltage output by the AC power supply 1, i.e., the power supply frequency. The absolute value |sin ωt| of the sine wave signal is a signal synchronized with the phase of the AC voltage vac, and is generated based on the detection values of the AC voltage vac.

The subtractor 34 computes a deviation Δiac between the output from the multiplier 33, i.e., the command value iac* for the total current Isum, and the total current Isum. The current controller 36 provides PI control on the deviation Δiac to generate a reference duty Dref.

The carrier signal generation unit 35 receives the total current Isum and correction quantities Tdl1, Tdl2, and Tdl3. The carrier signal generation unit 35 generates the carrier signals based on the total current Isum and on the correction quantities Tdl1, Tdl2, and Tdl3. The carrier signals are signals used for generation of the gate signals G3a, G3b, G3c, and G3d. In FIG. 3, the carrier signal used for generation of the gate signal G3a is denoted by "Car3a". Similarly, the carrier signal used for generation of the gate signal G3b is denoted by "Car3b", the carrier signal used for generation of the gate signal G3c is denoted by "Car3c", and the carrier signal used for generation of the gate signal G3d is denoted by "Car3d".

The correction quantities Tdl1, Tdl2, and Tdl3 are correction quantities relating to the phase differences between the corresponding carrier signals. When no correction is to be made, the correction quantities Tdl1, Tdl2, and Tdl3 all have a value of zero. In this case, the phase difference between each pair of the corresponding carrier signals is equal to the interleaving period. In the case of four-phase interleaving, the phase difference is 90°. Meanwhile, when correction is to be made, the phase difference between the phase-u carrier signal Car3a and the phase-v carrier signal Car3b is corrected based on the correction quantity Tdl1. Note that a specific method of generating the correction quantities Tdl1, Tdl2, and Tdl3 will be described later in relation to a second embodiment.

In a case in which the correction quantity Tdl1 represents the quantity of correction to be made to the phase difference to be corrected, the phase difference between the phase-u carrier signal Car3a and the phase-v carrier signal Car3b will be corrected to "90°+Tdl1". Similarly, in a case in which the correction quantity Tdl2 represents the quantity of correction to be made to the phase difference to be corrected, the phase difference between the phase-v carrier signal Car3b and the phase-w carrier signal Car3c will be corrected to "90°+Tdl2". In addition, in a case in which the correction quantity Tdl3 represents the quantity of correction to be made to the phase difference to be corrected, the phase difference between the phase-w carrier signal Car3c and the phase-x carrier signal Car3d will be corrected "90°+Tdl3".

Alternatively, in a case in which the correction quantity Tdl1 represents the quantity of correction to be made to the phase to be corrected, the phase of the phase-v carrier signal Car3b relative to the phase of the phase-u carrier signal Car3a will be corrected to "90°+Tdl1". Similarly, in a case in which the correction quantity Tdl2 represents the quantity of correction to be made to the phase to be corrected, the phase of the phase-w carrier signal Car3c relative to the phase of the phase-u carrier signal Car3a will be corrected to "180°+Tdl2". In addition, in a case in which the correction quantity Tdl3 represents the quantity of correction to be made to the phase to be corrected, the phase of the phase-x carrier signal Car3d relative to the phase of the phase-u carrier signal Car3a will be corrected to "270°+Tdl3". FIG. 4 illustrates the waveforms of the carrier signals in this example. In FIG. 4, the horizontal axis represents the phase, and the vertical axis represents the amplitude of each carrier signal.

Note that the foregoing description has been provided for examples in which the correction quantities Tdl1, Tdl2, and Tdl3 each represent the quantity of correction to be made to the phase difference to be corrected or the quantity of correction to be made to the phase to be corrected, but the applications are not limited to these examples. The correction quantities Tdl1, Tdl2, and Tdl3 may each be a correction quantity expressed by a time. In this case, the correction quantities Tdl1, Tdl2, and Tdl3 are converted into amounts relating to a phase difference or a phase in the carrier signal generation unit 35, and are then reflected in the carrier signals Car3a, Car3b, Car3c, and Car3d.

In addition, FIG. 4 illustrates the carrier signals being inverted sawtooth waves by way of example, but the waveform is not limited thereto. The carrier signals may each be a triangular wave or a sawtooth wave.

Returning to the description with reference to FIG. 3, one terminal (terminal +) of the comparator 37a receives the reference duty Dref generated by the current controller 36, and another terminal (terminal −) of the comparator 37a receives the carrier signal Car3a generated by the carrier signal generation unit 35. The comparator 37a compares the reference duty Dref and the amplitude value of the carrier signal Car_3a, and outputs the result of comparison. The other comparators 37b, 37c, and 37d perform similar operation, and description thereof will therefore be omitted herein to avoid duplicate description. As illustrated in FIG. 3, the output of the comparator 37a is the gate signal G3a to the switching element 3a, the output of the comparator 37b is the gate signal G3b to the switching element 3b, the output of the comparator 37c is the gate signal G3c to the switching element 3c, and the output of the comparator 37d is the gate signal G3d to the switching element 3d.

As described above, the gate signals G3a, G3b, G3c, and G3d generated by the control device 200 in the first embodiment are generated using the carrier signals Car3a, Car3b, Car3c, and Car3d, which have been corrected using the correction quantities Tdl1, Tdl2, and Tdl3. Thus, the unit converters 100a, 100b, 100c, and 100d operate according to the gate signals G3a, G3b, G3c, and G3d after the correction. This causes the switching elements 3a, 3b, 3c, and 3d in the respective unit converters to perform switching operation according to the change ΔVs in the applied voltage illustrated in FIG. 2. Specifically, the values of the On times Ton_a, Ton_b, Ton_c, and Ton_d in Equations (1) to (4) above change to equalize the current ripples ΔIu, ΔIv, ΔIw, and ΔIx expressed by Equations (1) to (4). Consequently, the unit converters are controlled such that the current differences, which represent imbalance among the reactor currents of the respective phases, are reduced.

Note that the current differences among the reactors in the respective unit converters are reduced by the correction operation described above. Meanwhile, the current ripple value of the reactor current of each of the unit converters is lower when the carrier signals have an equalized phase difference of 90°. That is, the control to correct the gate signals acts to reduce efficiency of the converter circuit 10. The control system of the first embodiment then places a limitation on the control operation of correcting the gate signals. Specifically, the foregoing correction to the gate signals is performed when the total current isum, which is the sum of the values of the reactor currents iu, iv, iw, and ix, is greater than a threshold.

Figure 5:
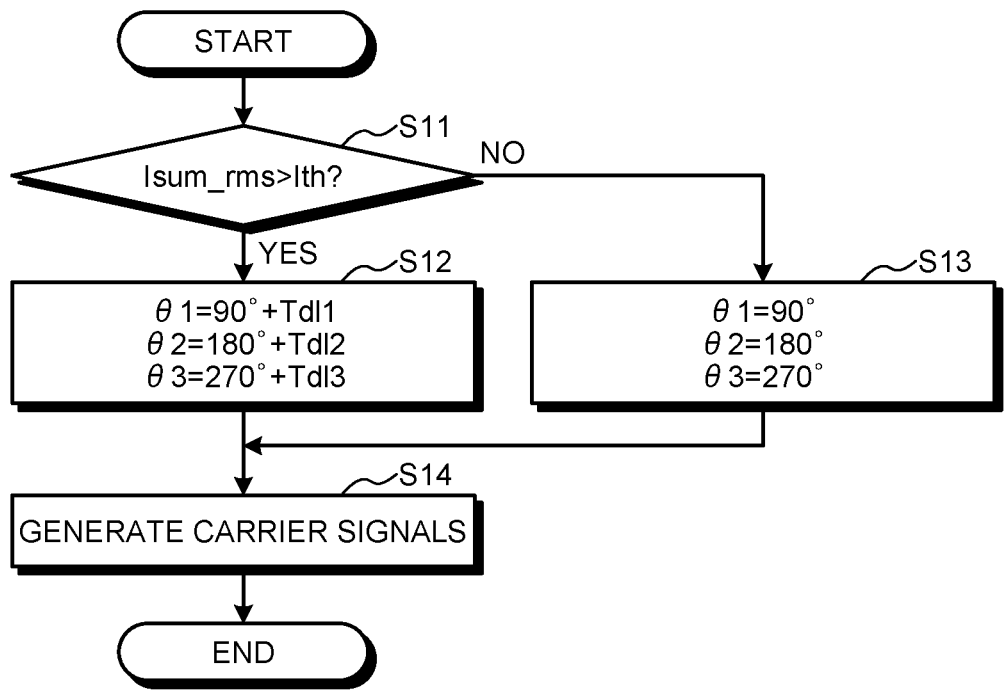
FIG. 5 is a flowchart for use in describing correction processing of carrier signals in the first embodiment.

FIG. 5 is a flowchart for use in describing the correction processing of the carrier signals in the first embodiment. The process of FIG. 5 is performed by the carrier signal generation unit 35 illustrated in FIG. 3.

In FIG. 5, the carrier signal generation unit 35 determines whether a root mean square (RMS) value Isum_rms of the total current isum is greater than a threshold Ith (step S11). If the RMS value Isum_rms of the total current isum is greater than the threshold Ith (Yes at step S11), the process proceeds to step S12, where the carrier signal generation unit 35 corrects the phase differences among the carrier signals. Specifically, as illustrated in the calculation at step S12 of FIG. 5, operation of θ1=90°+Tdl1, θ2=180°+Tdl2, and θ3=270°+Tdl3 is performed. The phase 81 is the phase of the phase-v carrier signal Car3b relative to the phase of the phase-u carrier signal Car3a. The phase 82 is the phase of the phase-w carrier signal Car3c relative to the phase of the phase-u carrier signal Car3a. The phase 83 is the phase of the phase-x carrier signal Car3d relative to the phase of the phase-u carrier signal Car3a. The carrier signal generation unit 35 generates the carrier signals Car3a, Car3b, Car3c, and Car3d using the phases 81, 82, and 83 corrected at step S12 (step S14).

Alternatively, if the RMS value Isum_rms of the total current isum is less than or equal to the threshold Ith (No at step S11), the process proceeds to step S13. No correction is performed on the phase differences among the carrier signals at step S13 of FIG. 5. Thus, the default values are used to perform an operation of θ1=90°, θ2=180°, and θ3=270°. The carrier signal generation unit 35 generates the carrier signals Car3a, Car3b, Car3c, and Car3d using the phases θ1, θ2, and θ3 computed at step S13 (step S14).

In a case in which no correction is performed, the phase-u carrier signal Car3a and the phase-v carrier signal Car3b have a phase difference of 90°. Alternatively, in a case in which correction is performed, the phase-u carrier signal Car3a and the phase-v carrier signal Car3b have a phase difference of 90°+Tdl1 {=(90°+Tdl1)−0°}.

In addition, in a case in which no correction is performed, the phase-v carrier signal Car3b and the phase-w carrier signal Car3c have a phase difference of 90° (=180°−90°). Alternatively, in a case in which correction is performed, the phase-v carrier signal Car3b and the phase-w carrier signal Car3c have a phase difference of 90°−Tdl1+Tdl2 {=(180°+Tdl2)−(90°+Tdl1)}.

Moreover, in a case in which no correction is performed, the phase-w carrier signal Car3c and the phase-x carrier signal Car3d have a phase difference of 90° (=270°−180°). Alternatively, in a case in which correction is performed, the phase-w carrier signal Car3c and the phase-x carrier signal Car3d have a phase difference of 90°−Tdl2+Tdl3 {=(270°+Tdl3)−(180°+Tdl2)}.

In the context of pairs of unit converters adjacent to each other as described above, four-phase interleaving results in a phase difference of 90° between each pair of the unit converters when no correction is performed. Note that the following description may refer to adjacent two unit converters as "first unit converter" and "second unit converter". The following description may refer to the phase difference between a pair of the unit converters when no correction is performed as "reference phase difference". The phase difference between the phase of the carrier signal for controlling the switching element of the first unit converter and the phase of the carrier signal for controlling the switching element of the second unit converter is equivalent to the phase difference between the phase at a time when the switching element of the first unit converter is turned on and the phase at a time when the switching element of the second unit converter is turned on. Accordingly, the following description may refer to the phase at a time when the switching element of the first unit converter is turned on as "first phase", and the phase at a time when the switching element of the second unit converter is turned on as "second phase".

In a case in which the first unit converter is the unit converter 100a and the second unit converter is the unit converter 100b, the first phase is "0°" and the second phase is "90°+Tdl1". Otherwise, in a case in which the first unit converter is the unit converter 100b, and the second unit converter is the unit converter 100c, the first phase is "90°+Tdl1" and the second phase is "180°+Tdl2". Alternatively, in a case in which the first unit converter is the unit converter 100c, and the second unit converter is the unit converter 100d, the first phase is "180°+Tdl2" and the second phase is "270°+Tdl3".

Note that "No" is determined at step S11 described above in the case when the RMS value Isum_rms of the total current Isum is equal to the threshold Ith; however, "Yes" may be determined in such a case. That is, when the RMS value Isum_rms is equal to the threshold Ith, either "Yes" or "No" may be determined.

In addition, although the RMS value Isum_rms of the total current Isum and the threshold Ith are compared at step S11 described above, the decision criterion is not limited thereto. Instead of the total current isum, the average current iavg, which is the average value of the values of the reactor currents iu, iv, iw, and ix, may be used.

As described above, the power conversion apparatus according to the first embodiment causes the phase difference between the first phase and the second phase to change from the reference phase difference when the first current is greater than a threshold, where the first current is the total current or the average current of the currents detected by the respective multiple current detectors. This enables the reactor currents to be equalized among the multiple unit converters. Equalization of the reactor currents can in turn avoid a situation where a specific reactor heats to a high temperature. This can avoid an increase in size of the reactors.

In addition, in the power conversion apparatus according to the first embodiment, the phase difference between the first phase and the second phase remains the reference phase difference when the first current does not exceed the threshold. This can reduce an increase in the current ripple value of the reactor current of each of the unit converters, and can thus avoid reduction in efficiency of the converter circuit. In view of the foregoing, the power conversion apparatus according to the first embodiment is capable of equalizing reactor currents while reducing a reduction in efficiency of the converter.

Moreover, the correction method in the first embodiment allows the gate signals to be corrected while maintaining the duty value before the correction, that is, without changing the reference duty. This reduces the effect of computation speed or of computational error of the control device on the computational precision with respect to the duty value, thereby allowing use of a low-price processor even when the switching elements are to be driven at a high speed. This can reduce or prevent an increase in device cost.

Second Embodiment

Figure 6:
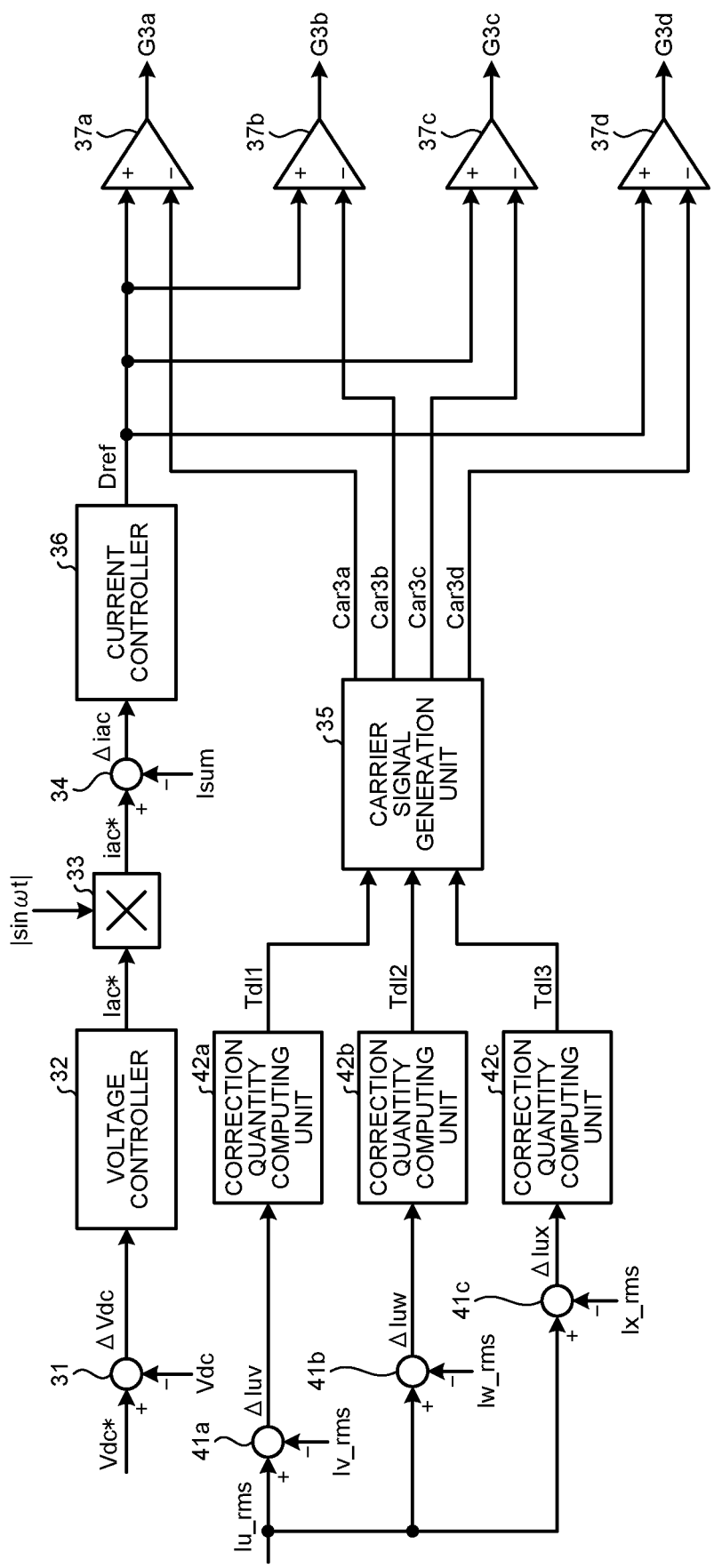
FIG. 6 is a block diagram illustrating an example configuration of a control system in a second embodiment.

The description of a second embodiment will deal with a specific method of generating the correction quantities Tdl1, Tdl2, and Tdl3 described in the first embodiment. FIG. 6 is a block diagram illustrating an example configuration of a control system in the second embodiment. The control system illustrated in FIG. 6 further includes subtractors 41$a$, 41$b$, and 41$c$ and correction quantity computing units 42$a$, 42$b$, and 42$c$ in addition to the elements of the control system illustrated in FIG. 3. The other part of the configuration is the same as or equivalent to the corresponding part of the configuration of FIG. 3. The same as or equivalent components are designated by like reference characters, and duplicate description will be omitted.

In FIG. 6, the subtractor 41$a$ receives an RMS value Iv_rms of the reactor current iv, the subtractor 41$b$ receives an RMS value Iw_rms of the reactor current iw, and the subtractor 41$c$ receives an RMS value Ix_rms of the reactor current ix. In addition, in FIG. 6, phase u is the reference phase, and the subtractors 41$a$, 41$b$, and 41$c$ receive, in common, an RMS value Iu_rms of the reactor current iu flowing through the reactor 4$a$ of the unit converter 100$a$ of the reference phase. Note that when phase u is the reference phase, phase v, phase w, and phase x other than phase u may each be referred to as "correction target phase".

The RMS value Iu_rms of the reactor current iu is computed using the detection value of the current detector 8$a$. The RMS value Iv_rms of the reactor current iv is computed using the detection value of the current detector 8$b$. The RMS value Iw_rms of the reactor current iw is computed using the detection value of the current detector 8$c$. The RMS value Ix_rms of the reactor current ix is computed using the detection value of the current detector 8$d$.

The subtractor 41$a$ computes a difference ΔIuv between the RMS value Iu_rms of the reactor current iu and the RMS value Iv_rms of the reactor current iv. The subtractor 41$b$ computes a difference ΔIuw between the RMS value Iu_rms of the reactor current iu and the RMS value Iw_rms of the reactor current iw. The subtractor 41$c$ computes a difference ΔIux between the RMS value Iu_rms of the reactor current iu and the RMS value Ix_rms of the reactor current ix.

The correction quantity computing unit 42$a$ computes the correction quantity Tdl1 based on the difference ΔIuv. The correction quantity computing unit 42$b$ computes the correction quantity Tdl2 based on the difference ΔIuw. The correction quantity computing unit 42$c$ computes the correction quantity Tdl3 based on the difference ΔIux. The specific formulae for calculating the correction quantities Tdl1, Tdl2, and Tdl3 can be expressed by Equations (5) to (7) below.

[Formula 1]

$$Tdl1 = \begin{cases} Tdl1\_max & (5) \\ a1 * (Iu_{\_rms} - Iv_{\_rms}) \\ Tdl1\_min \end{cases}$$

$$Tdl2 = \begin{cases} Tdl2\_max & (6) \\ a2 * (Iu_{\_rms} - Iw_{\_rms}) \\ Tdl2\_min \end{cases}$$

$$Tdl3 = \begin{cases} Tdl3\_max & (7) \\ a3 * (Iu_{\_rms} - Ix_{\_rms}) \\ Tdl3\_min \end{cases}$$

In Equations (5) to (7) above, a1, a2, a3 are each a feedback gain in feedback compensation. In addition, Tdl1_max, Tdl2_max, and Tdl3_max are upper limit values of the respective correction quantities, and Tdl1_min, Tdl2_min, and Tdl3_min are lower limit values of the respective correction quantities. These upper limit values and lower limit values are setting values for preventing a change in the sequential order of outputting of the carrier signals Car3$a$, Car3$b$, Car3$c$, and Car3$d$.

Figure 7:
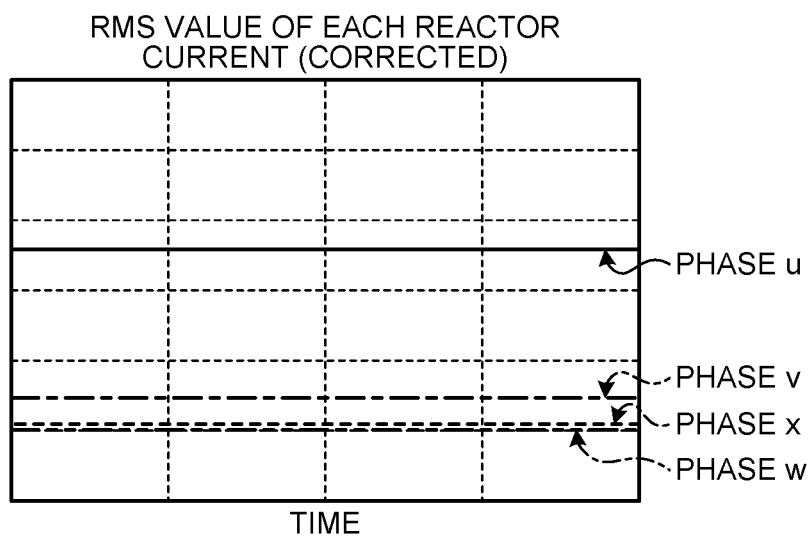
FIG. 7 is a diagram for use in describing an advantage of the power conversion apparatus according to the first embodiment and to the second embodiment.
Figure 8:
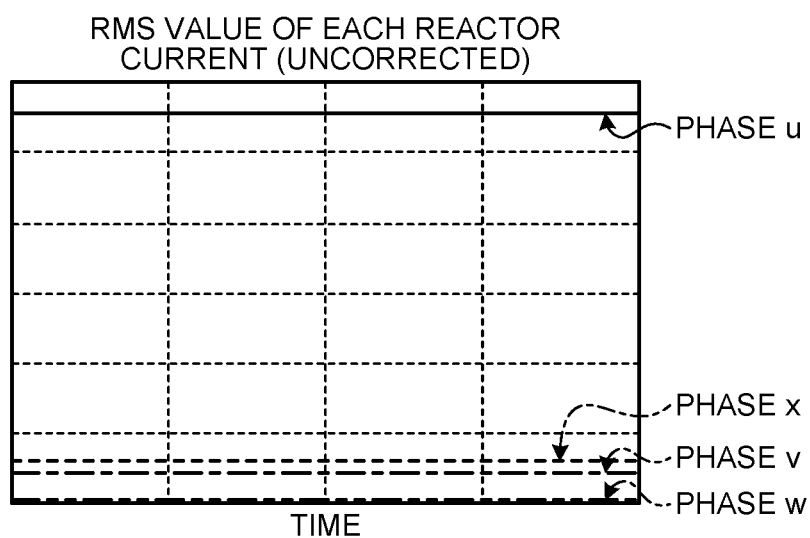
FIG. 8 is a comparative diagram for use in describing the advantage of the power conversion apparatus according to the first embodiment and to the second embodiment.

FIG. 7 is a diagram for use in describing an advantage of the power conversion apparatus 120 according to the first embodiment and to the second embodiment. FIG. 8 is a comparative diagram for use in describing the advantage of the power conversion apparatus 120 according to the first embodiment and to the second embodiment. The diagrams illustrated in FIGS. 7 and 8 each illustrate a result of numerical simulation. Specifically, FIG. 7 illustrates a simulation result when the foregoing correction control was performed, while FIG. 8 illustrates a simulation result when the foregoing correction control was not performed. In FIGS. 7 and 8, the solid line represents the RMS value of the phase-u reactor current, the dashed-and-dotted line represents the RMS value of the phase-v reactor current, the dashed-double-dotted line represents the RMS value of the phase-w reactor current, and the broken line represents the RMS value of the phase-x reactor current. Note that the simulations were performed under a condition that the inductance values La, Lb, Lc, and Ld have a relationship of La<Lb=Lc=Ld.

As described above, the reactor 4$a$ in the unit converter 100$a$ has an inductance value less than the inductance values of the reactors 4$b$, 4$c$, and 4$d$ in the other three unit converters 100$b$, 100$c$, and 100$d$. Thus, when no correction control is performed, the RMS value of the phase-u reactor current is greater than the RMS values of the respective phase-v, phase-w, and phase-x reactor currents as illustrated in FIG. 8. In contrast, comparison between FIG. 7 and FIG. 8 indicates that when correction control is performed, the RMS value of the phase-u reactor current is reduced, and the RMS values of the respective phase-v, phase-w, and phase-x reactor currents are increased. That is, FIGS. 7 and 8 indicate that the correction control equalizes, or reduce the difference between, the reactor currents among the multiple unit converters.

As described above, the power conversion apparatus according to the second embodiment computes a correction quantity based on the difference between the RMS value of the reactor current flowing through the reactor of the unit converter of the reference phase and the RMS value of the reactor current flowing through the reactor of the unit converter of a correction target phase, and computes the first and second phases based on the correction quantities. This enables the reactor currents in the respective unit converters to be equalized. In addition, the reactor currents can be equalized also when the inductance values of the respective reactors differ from one another.

Third Embodiment

Figure 9:
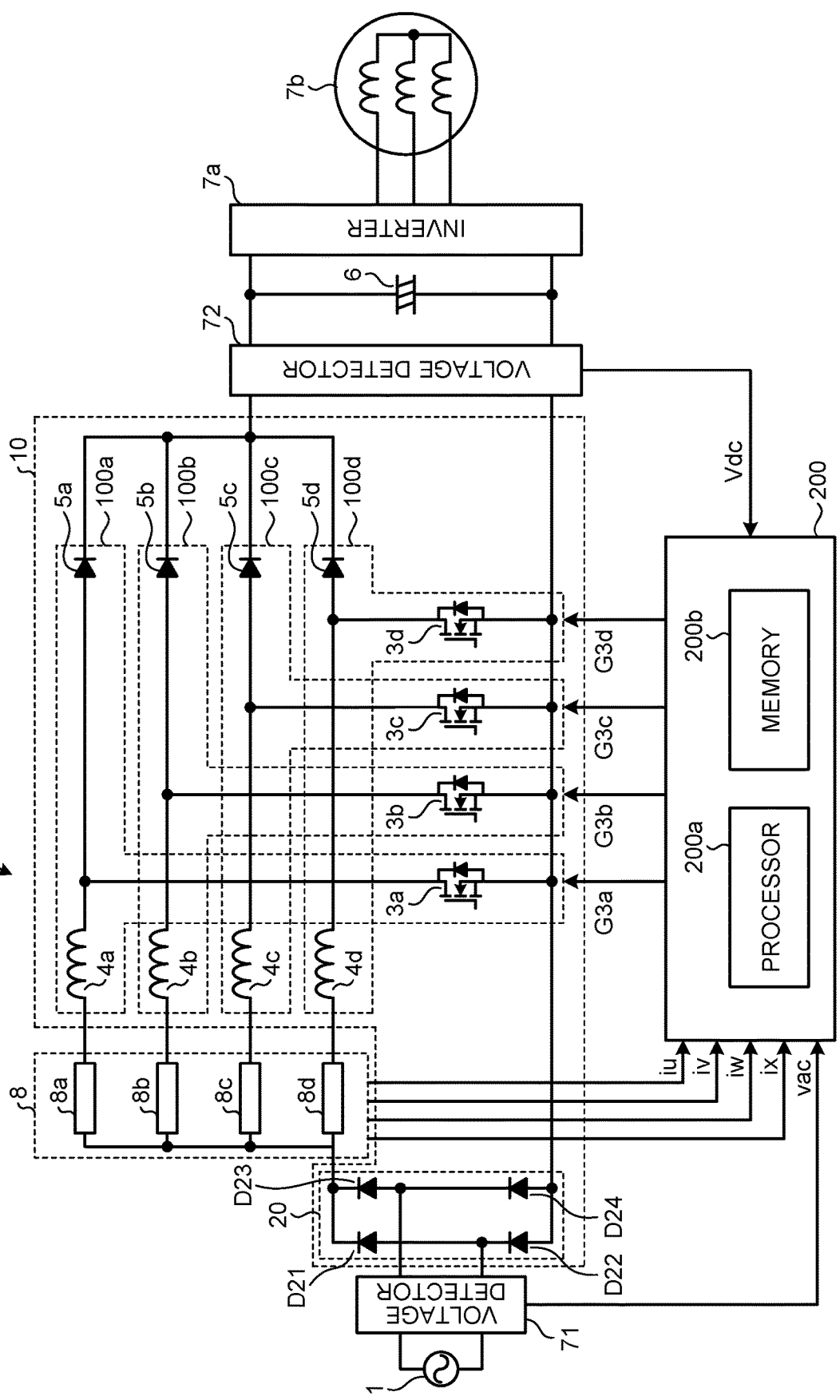
FIG. 9 is a diagram illustrating an example configuration of a motor drive apparatus according to a third embodiment.

The description of a third embodiment will deal with an example application of the power conversion apparatus 120 described in the first embodiment and in the second embodiment, to a motor drive apparatus. FIG. 9 is a diagram illustrating an example configuration of a motor drive apparatus 150 according to the third embodiment. The motor drive apparatus 150 according to the third embodiment illustrated in FIG. 9 includes an inverter 7a and a motor 7b in addition to the elements of the power conversion apparatus 120 illustrated in FIG. 1.

The output of the inverter 7a is connected to the motor 7b. The motor 7b is an example of a load device. The inverter 7a converts DC power stored in the smoothing capacitor 6 into AC power, and supplies the AC power obtained by the conversion to the motor 7b for driving of the motor 7b. The motor drive apparatus 150 illustrated in FIG. 9 is applicable to products such as a blower, a compressor, and an air conditioner.

Figure 10:
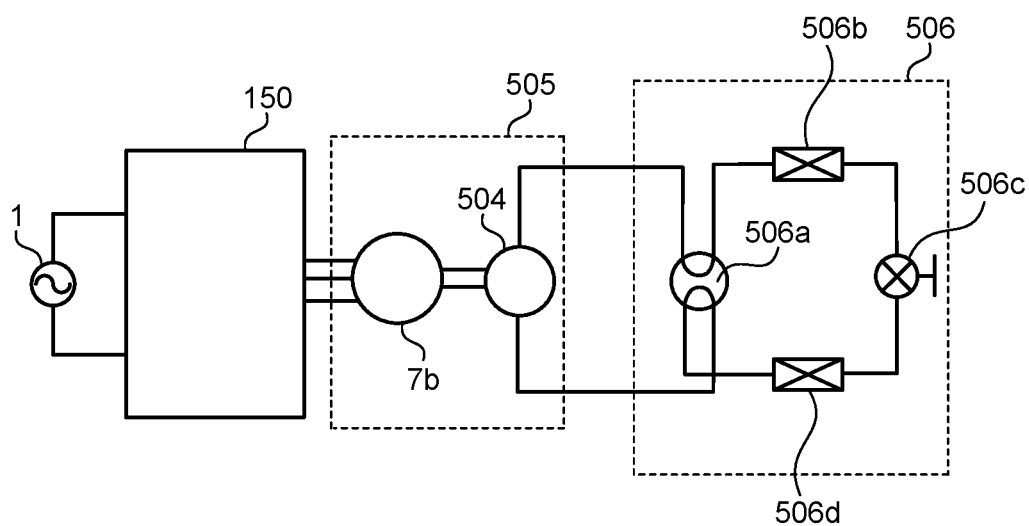
FIG. 10 is a diagram illustrating an example of use of the motor drive apparatus illustrated in FIG. 9 in an air conditioner.

FIG. 10 is a diagram illustrating an example of use of the motor drive apparatus 150 illustrated in FIG. 9 in an air conditioner. The output of the motor drive apparatus 150 is connected to the motor 7b, and the motor 7b is coupled to a compression element 504. The motor 7b and the compression element 504 are included in a compressor 505. A refrigeration cycle unit 506 is configured to include a four-way valve 506a, an indoor heat exchanger 506b, an expansion valve 506c, and an outdoor heat exchanger 506d.

The flow channel of a refrigerant that circulates in the air conditioner is configured to start from the compression element 504, pass through the four-way valve 506a, the indoor heat exchanger 506b, the expansion valve 506c, and the outdoor heat exchanger 506d, and again through the four-way valve 506a, and then return to the compression element 504. The motor drive apparatus 150 is supplied with electric power from the AC power supply 1, and rotates the motor 7b. The rotation of the motor 7b causes the compression element 504 to compress the refrigerant and thus to allow the refrigerant to circulate in the refrigeration cycle unit 506.

The motor drive apparatus 150 according to the third embodiment is configured to include the power conversion apparatuses 120 according to the first embodiment and to the second embodiment. This enables products such as a blower, a compressor, and an air conditioner including the motor drive apparatus according to the third embodiment to provide advantages described in the first embodiment and in the second embodiment.

Note that the configurations described in the foregoing embodiments are merely examples of various aspects of the present invention. These configurations may be combined with a known other technology, and moreover, a part of such configurations may be omitted and/or modified without departing from the spirit of the present invention.

REFERENCE SIGNS LIST

1 AC power supply; 3a, 3b, 3c, 3d switching element; 4a, 4b, 4c, 4d reactor; 5a, 5b, 5c, 5d backflow-preventing diode; 6 smoothing capacitor; 7a inverter; 7b motor; 8 current detection unit; 8a, 8b, 8c, 8d current detector; 10 converter circuit; 20 rectification circuit; 31, 34, 41a, 41b, 41c subtractor; 32 voltage controller; 33 multiplier; 35 carrier signal generation unit; 36 current controller; 37a, 37b, 37c, 37d comparator; 42a, 42b, 42c correction quantity computing unit; 71, 72 voltage detector; 100a, 100b, 100c, 100d unit converter; 120 power conversion apparatus; 150 motor drive apparatus; 200 control device; 200a processor; 200b memory; 504 compression element; 505 compressor; 506 refrigeration cycle unit; 506a four-way valve; 506b indoor heat exchanger; 506c expansion valve; 506d outdoor heat exchanger.

The invention claimed is:

1. A power conversion apparatus comprising:
a converter circuit comprising a plurality of unit converters and converting an alternating-current voltage output from an alternating-current power supply into a direct-current voltage, the unit converters each comprising a reactor and at least one switching element; and
a plurality of current detectors detecting currents flowing through the respective reactors, wherein
in first and second unit converters adjacent to each other among the unit converters, when a first current is greater than a threshold, a phase difference between a first phase and a second phase is changed from a reference phase difference, the first current being a total current or an average current of currents detected by the plurality of current detectors,
the first phase is a phase at a time when the switching element of the first unit converter is turned on, and
the second phase is a phase at a time when the switching element of the second unit converter is turned on.

2. The power conversion apparatus according to claim 1, wherein
a correction quantity is computed based on a difference between a root mean square value of a reactor current flowing through the reactor of one of the unit converters of a reference phase and a root mean square value of a reactor current flowing through the reactor of another one of the unit converters of a correction target phase, and
the first and second phases are computed based on the correction quantity.

3. The power conversion apparatus according to claim 1, wherein
a gate signal for controlling the switching element is generated based on a result of comparison between a reference duty and a carrier signal, and
the gate signal is corrected based on a phase difference between the carrier signals without changing the reference duty.

4. The power conversion apparatus according to claim 1, wherein
a plurality of the switching elements are formed of a wide bandgap semiconductor.

5. The power conversion apparatus according to claim 4, wherein
the wide bandgap semiconductor is silicon carbide, gallium nitride, gallium oxide, or diamond.

6. A motor drive apparatus comprising:
the power conversion apparatus according to claim 1; and
an inverter converting direct-current power output from the power conversion apparatus into alternating-current power.

7. A blower comprising
the motor drive apparatus according to claim 6.

8. An air conditioner comprising
the blower according to claim 7.

9. A compressor comprising the motor drive apparatus according to claim 6.

10. An air conditioner comprising the compressor according to claim 9.

* * * * *